United States Patent
Iwamoto

(10) Patent No.: US 6,232,246 B1
(45) Date of Patent: May 15, 2001

(54) METHOD OF FABRICATING SEMICONDUCTOR DEVICE

(75) Inventor: Hayato Iwamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/268,340

(22) Filed: Mar. 16, 1999

(30) Foreign Application Priority Data

Mar. 18, 1998 (JP) .................................................. 10-069004

(51) Int. Cl.[7] ................................................. H01L 21/469
(52) U.S. Cl. ............................ 438/778; 438/699; 438/780
(58) Field of Search ................................... 438/778, 705, 438/755, 783, 624, 631, 699, 760, 780; 156/636, 637, 657; 257/647, 758, 760

(56) References Cited

U.S. PATENT DOCUMENTS

| | | | | |
|---|---|---|---|---|
| 5,302,198 | * | 4/1994 | Allman | 106/287 |
| 5,319,247 | * | 6/1994 | Matsuura | 257/760 |
| 5,459,105 | * | 10/1995 | Matsuura | 438/669 |
| 5,575,886 | * | 11/1996 | Murase | 156/636 |
| 5,863,344 | * | 1/1999 | Nam | 438/755 |
| 5,904,557 | * | 5/1999 | Komiya et al. | 438/633 |
| 6,004,887 | * | 12/1999 | Matsuno | 438/783 |
| 6,068,000 | * | 5/2000 | Tanabe et al. | 438/705 |

* cited by examiner

*Primary Examiner*—David Nelms
*Assistant Examiner*—Phuc T. Dang
(74) *Attorney, Agent, or Firm*—Ronald P. Kananen; Rader, Fishman & Grauer

(57) ABSTRACT

Disclosed is a method of fabricating a semiconductor device, including the steps of: forming an interconnection pattern on the surface of a semiconductor substrate by etching; treating the interconnection pattern and a portion, not covered with the interconnection pattern, of the substrate surface using an organic amine based resist releasing liquid containing at least a lower aminoalcohol, water, and an anti-corrosion agent; and forming a $SiO_2$ film (for example, $O_3$-TEOS-NSG film) on the interconnection pattern and the portion, not covered with the interconnection pattern, of the substrate surface, using ozone and an organic silicon source. This is effective to reduce the pattern dependence on the thickness in $SiO_2$ film formed on the interconnection pattern.

18 Claims, 5 Drawing Sheets

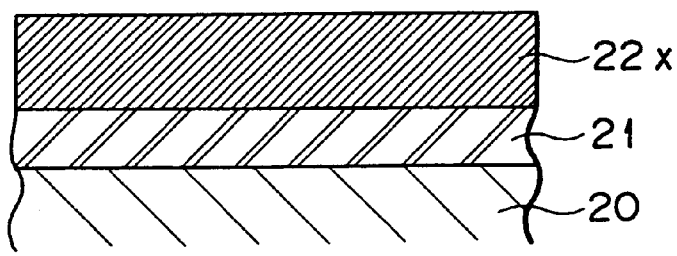
F I G. 1 A
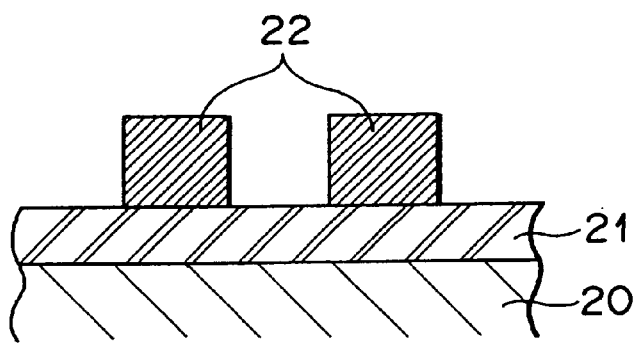
F I G. 1 B
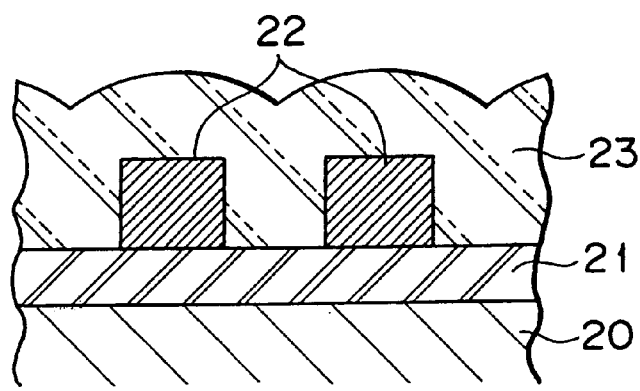
F I G. 1 C

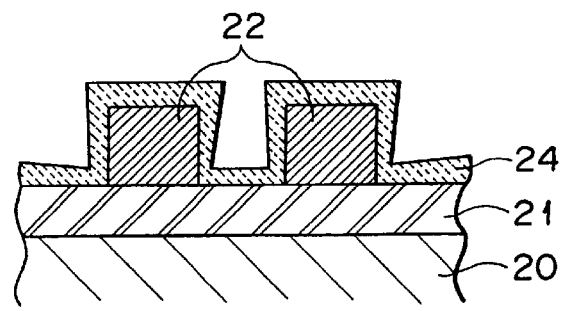
FIG. 2A
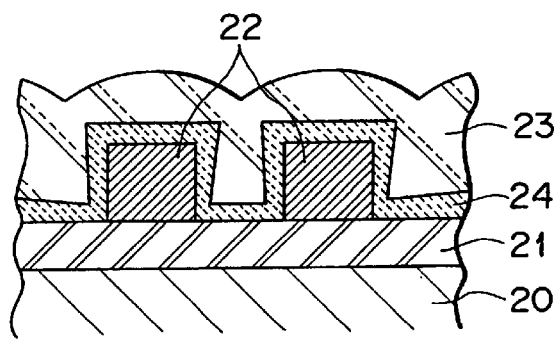
FIG. 2B
FIG. 3
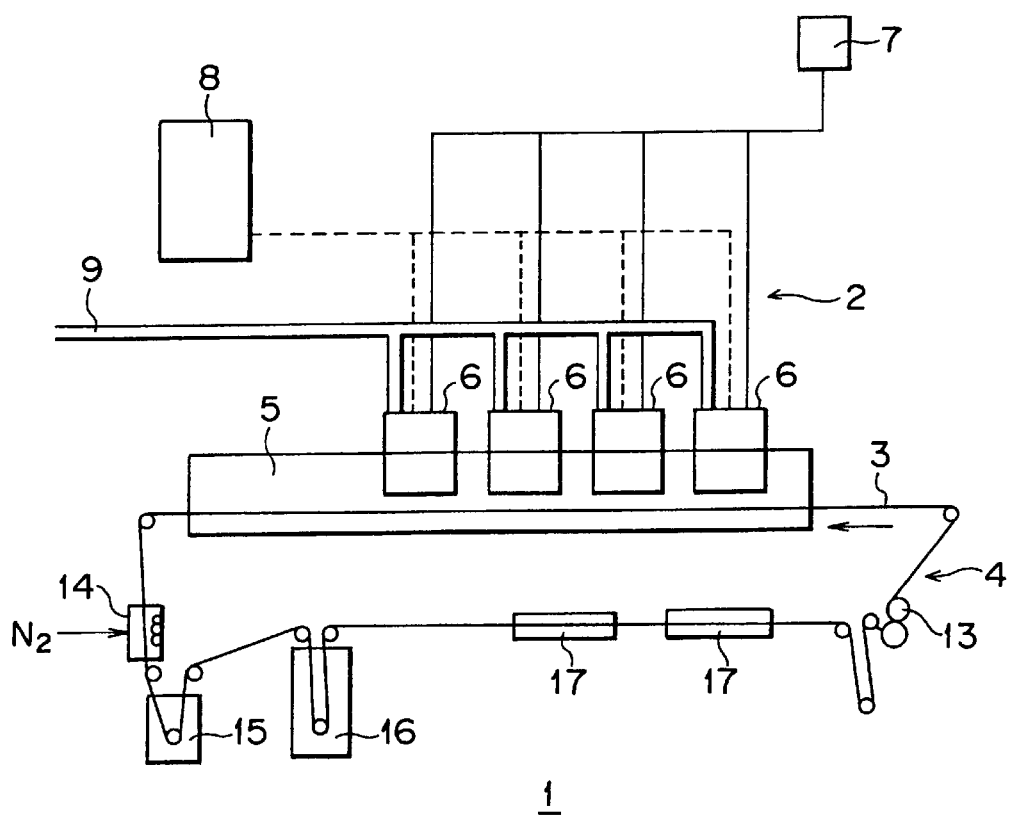

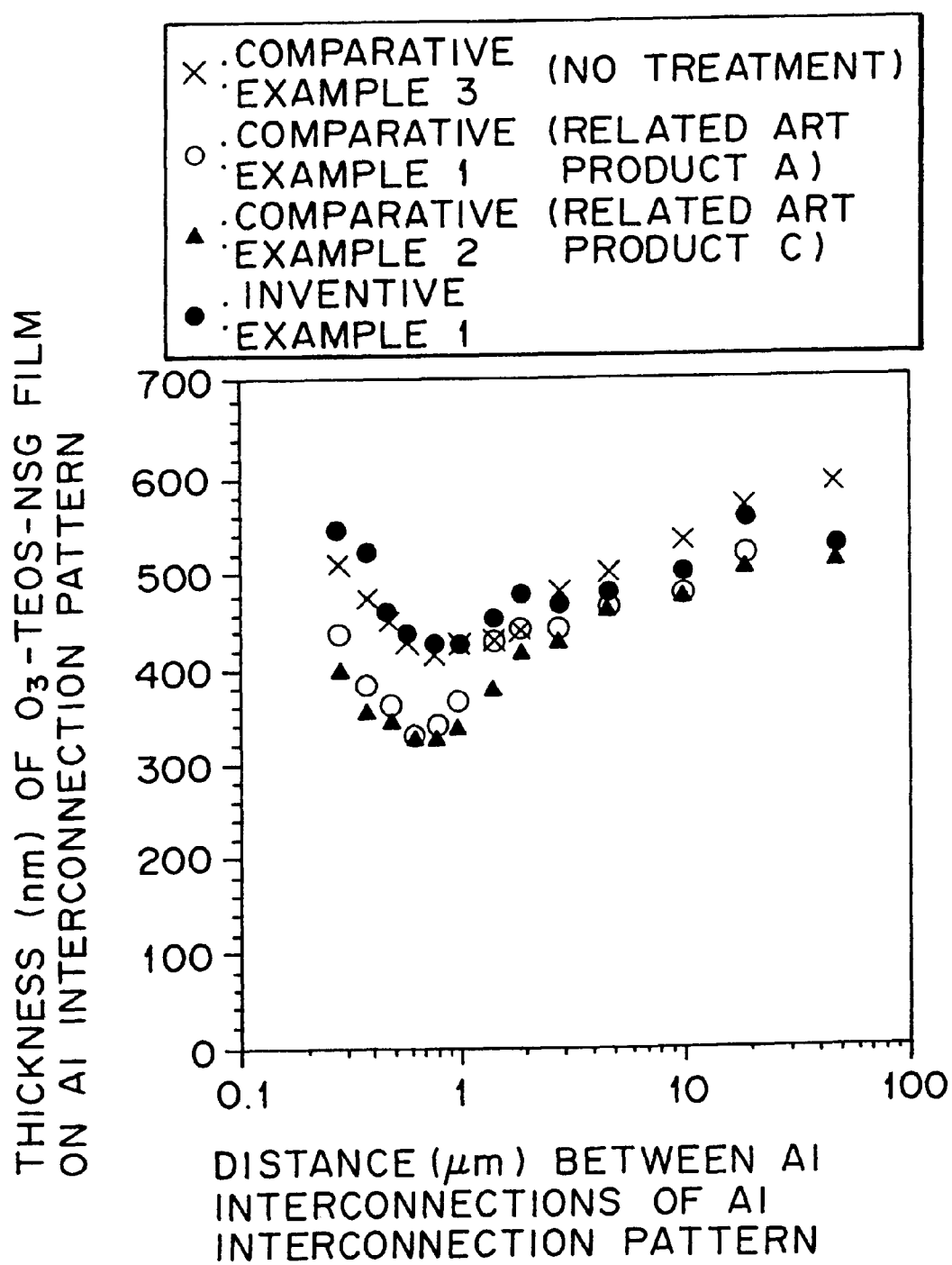

METHOD OF FABRICATING SEMICONDUCTOR DEVICE

BACKGROUND OF THE INVENTION

The present invention relates to a method of fabricating a semiconductor device, including the step of forming a $SiO_2$ film, as an interlayer insulating film covering an interconnection pattern, using ozone and an organic silicon source.

In fabrication of a semiconductor device, a multi-layer interconnection structure is generally formed in accordance with the following procedure. A resist pattern is first formed on an interconnection layer having been formed on a semiconductor substrate, and an interconnection pattern is formed by etching using the resist pattern as a mask. The entire surface of the semiconductor substrate is then treated using an organic amine based resist releasing liquid to remove sub-products such as polymers produced by etching, and an interlayer insulating film is formed on the interconnection pattern thus treated. After that, the next interconnection pattern is similarly formed, to thus form the multi-layer interconnection structure.

Along with the recent trend toward higher density and higher integration of semiconductor devices, the technique of forming the multi-layer interconnection structure becomes increasingly important in fabrication of semiconductor devices. In particular, with respect to an interlayer insulating film, it is required that spaces between interconnections of a fine interconnection pattern are buried with the interlayer insulating film without occurrence of any cavity and that surface steps of the interlayer insulating film are planarized. To meet all of these requirements, however, the interlayer insulating film still has various technical problems.

As an interlayer insulating film having excellent step coverage and self-planarization characteristics and capable of solving the above problems, attention is being given to a $SiO_2$ film formed using ozone and an organic silicon source, especially, a $SiO_2$ film formed at a normal pressure using TEOS (Tetra Ethyl Ortho Silicate) as the organic silicon source [hereinafter, referred to as "$O_3$-TEOS-NSG (Nondoped Silicate Glass) film"].

FIG. 3 shows an apparatus for forming such a $O_3$-TEOS-NSG film, which apparatus includes a film formation unit 2 for forming a film on a wafer (Si Substrate), and a carrier unit 4 having a belt 3 for carrying the wafer.

The film formation unit 2 has a muffle 5 disposed to extend along the movement direction of the belt 3 and to cover part of the belt 3, and four injectors 6 sequentially arranged in the movement direction of the belt 3. Each injector 6 is disposed directly over the belt 3 in such a manner that the lower portion of the injector 6 is positioned in the muffle 5. The four injectors 6 have the same configuration. In the example shown in FIG. 3, the injectors 6 are connected, directly or indirectly by way of pipes, to a supply unit 7 for supplying TEOS, a $O_3$ generating unit 8, a nitrogen supply unit (not shown), and an exhaust pipe 9 connected to an exhaust device (not shown).

FIG. 4 is a typical view of the injector 6. As shown in FIG. 4, the injector 6 is designed to supply, onto a wafer W placed on the belt 3, a mixed gas ($O_3/O_2$) and TEOS which are separated from each other by means of nitrogen.

To be more specific, the injector 6 has a rectangular pallelopiped housing 10 with its bottom opened, a partition box 11 provided in the housing 10, and a blowout portion 12 provided in the partition box 11. The blowout portion 12 is connected to the supply unit 7, $O_3$ generating unit 8 and nitrogen supply unit by way of pipes, and the gases supplied therefrom are separated from each other in the blowout portion 12 by means of partition plates (not shown). Upon blowout of the reaction gases, namely, the mixed gas ($O_3/O_2$) and TEOS gas from the blowout portion 12 on the wafer W, nitrogen (separator $N_2$) is allowed to flow between these reaction gases. The exhaust pipe 9 is connected between the housing 10 and the partition box 11 in order to forcibly exhaust, from the surface of the wafer W, the residue of the gases having been supplied on the wafer W and used to react with each other for forming a $O_3$-TEOS-NSG film.

The carrier unit 4 includes the belt 3 for carrying the wafer W placed on the belt 3, and a belt drive unit 13, such as a motor, for moving the belt 3. A heating chamber 14 for heating the wafer W in a $N_2$ atmosphere, a ultrasonic cleaning bath 15, a rinse bath 16, and an HF etching bath 17 are sequentially arranged along the movement direction (shown by the arrow) of the belt 3.

In the film formation apparatus 1 having the above configuration, $O_3$ and TEOS supplied from the four injectors 6 onto the wafer W carried by the belt 3 react with each other on the wafer W, to form a $O_3$-TEOS-NSG film on the wafer W.

The thickness of the $O_3$-TEOS-NSG film formed by the above film formation apparatus 1, however, largely varies depending on the distance between interconnections of an interconnection pattern, namely, it exhibits the pattern dependency.

For example, as will be described later in Comparative Examples 1 and 2, an Al (Aluminum) interconnection pattern of Al interconnections each having a width of 600 nm and a height of 650 nm is formed on a semiconductor substrate in such a manner that the Al interconnections are spaced from each other at specific intervals, followed by treatment of the entire surface of the semiconductor substrate with a related art organic amine based resist releasing liquid, and a $O_3$-TEOS-NSG film is formed by the above film formation apparatus 1. In this case, the space width (distance) between the Al interconnections of the Al interconnection pattern and the thickness of the $O_3$-TEOS-NSG film formed on the Al interconnection pattern exhibits a relationship shown in FIG. 7. As is apparent from the figure, the thickness of the $O_3$-TEOS-NSG film formed on the Al interconnection pattern largely varies depending on the distance between the Al interconnections of the Al interconnection pattern.

If there occurs a larger variation in thickness of the $O_3$-TEOS-NSG film in fabrication of a semiconductor device, the difference in thickness of the $O_3$-TEOS-NSG film remains even by planarizing the $O_3$-TEOS-NSG film by etching-back after formation of the $O_3$-TEOS-NSG film, with a result that steps are formed in the interconnection pattern within a chip. In this case, if the step is larger than the focal depth of photolithography, there occurs a problem that it is difficult to perform the subsequent photo-resist treatment.

SUMMARY OF THE INVENTION

An object of the present invention is to provide a method of fabricating a semiconductor device, including the step of forming a $SiO_2$ film such as a $O_3$-TEOS-NSG film using ozone and an organic silicon source on an interconnection pattern formed on a semiconductor substrate, which method is capable of reducing the pattern dependency on the thickness in the $SiO_2$ film formed on the interconnection pattern, thereby allowing photolithgraphy subsequent to formation of the $SiO_2$ film to be performed without occurrence of any problem.

The above-described problem are overcome according to the present invention, and experimentally found that in the case where an interconnection pattern is formed by etching and subsequent treatment of the interconnection pattern and a portion, not covered with the interconnection pattern, of the substrate surface using an organic amine based resist releasing liquid to remove sub-products produced by etching, the components of the organic amine based resist releasing liquid exerting a large effect on the pattern dependency of the thickness in a $SiO_2$ film such as a $O_3$-TEOS-NSG film to be formed later.

According to the present invention, there is provided a method of fabricating a semiconductor device, including the steps of: forming an interconnection pattern on the surface of a semiconductor substrate by etching;treating the interconnection pattern and a portion, not covered with the interconnection pattern, of the substrate surface using an organic amine based resist releasing liquid containing at least a lower aminoalcohol, water, and an anti-corrosion agent; and forming a $SiO_2$ film on the interconnection pattern and the portion, not covered with the interconnection pattern, of the substrate surface, using ozone and an organic silicon source.

According to the above fabrication method of the present invention, as will be apparent from experimental data to be described later, at the step of forming an interconnection pattern by etching and removing sub-products such as polymers produced by etching, the removal of the sub-products is performed using an organic amine based resist releasing liquid having a specific composition in place of the related art organic amine based resist releasing liquid. Accordingly, the pattern dependency on a $SiO_2$ film, such as a $O_3$-TEOS-NSG film, to be formed at the subsequent step can be reduced.

The reason why the pattern dependency on a $SiO_2$ film is largely dependent on a releasing liquid used for post-etching treatment performed after formation of an interconnection pattern by etching may be that the deposited amount of the $SiO_2$ film differs depending on an undercoat, or specifically the undercoating treatment.

FIG. 5 shows the results of examining the deposited amount of a $O_3$-TEOS-NSG film in a test performed by forming a plasma TEOS film as an undercoat on a semiconductor substrate, treating the surface of the plasma TEOS film using each of three kinds of related art organic amine based resist releasing liquids (related art products A, B and C) and the inventive organic amine based resist releasing liquid, or not treating the surface of the plasma TEOS film using any releasing liquid, and forming a $O_3$-TEOS-NSG film on the plasma TEOS film thus treated. In this case, the manner (condition) of treating the releasing liquid is carried out by spraying, and the film formation condition of the $O_3$-TEOS-NSG film is the same as that to be described later in the preferred embodiments of the invention.

From the results shown in FIG. 5, it is revealed that the deposited amount of the film in the case of treatment using the related art organic amine based resist releasing liquid is significantly less than in the case of no treatment using any releasing liquid. While the deposited amount of the film in the case of treatment using the inventive organic amine based resist releasing liquid is substantially equal to that in the case of no treatment using any releasing liquid. As a result, it becomes apparent that the inventive organic amine based resist releasing liquid is effective to suppress the undercoat dependency on the film thickness.

BRIEF DESCRIPTION OF THE DRAWINGS

FIGS. 1A to 1C are views illustrating steps of forming an $O_3$-TEOS-NSG film on an Al interconnection pattern;

FIGS. 2A and 2B are views illustrating steps of forming an $O_3$-TEOS-NSG film on an Al interconnection pattern after the Al interconnection pattern is covered with a plasma TEOS film;

FIG. 3 is a schematic view showing the configuration of a film formation apparatus;

FIG. 6 is a graph showing a relationship between a distance between Al interconnections of an Al interconnection pattern and a thickness of a $O_3$-TEOS-NSG film formed on the Al interconnection pattern in each of Inventive Examples and FIG. 7 is a graph showing a relationship between a distance between Al interconnections of an Al interconnection pattern and a thickness of a $O_3$-TEOS-NSG film formed on the Al interconnection pattern in each of Comparative Examples.

DETAILED DESCRIPTION OF THE PREFERRED EMBODIMENTS

Figure 4:
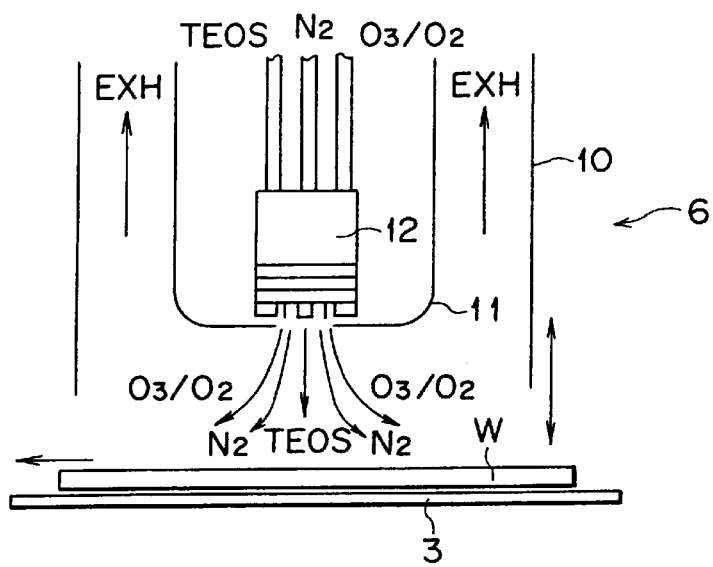
FIG. 4 is a schematic view showing the configuration of an injector shown in FIG. 3.
Figure 5:
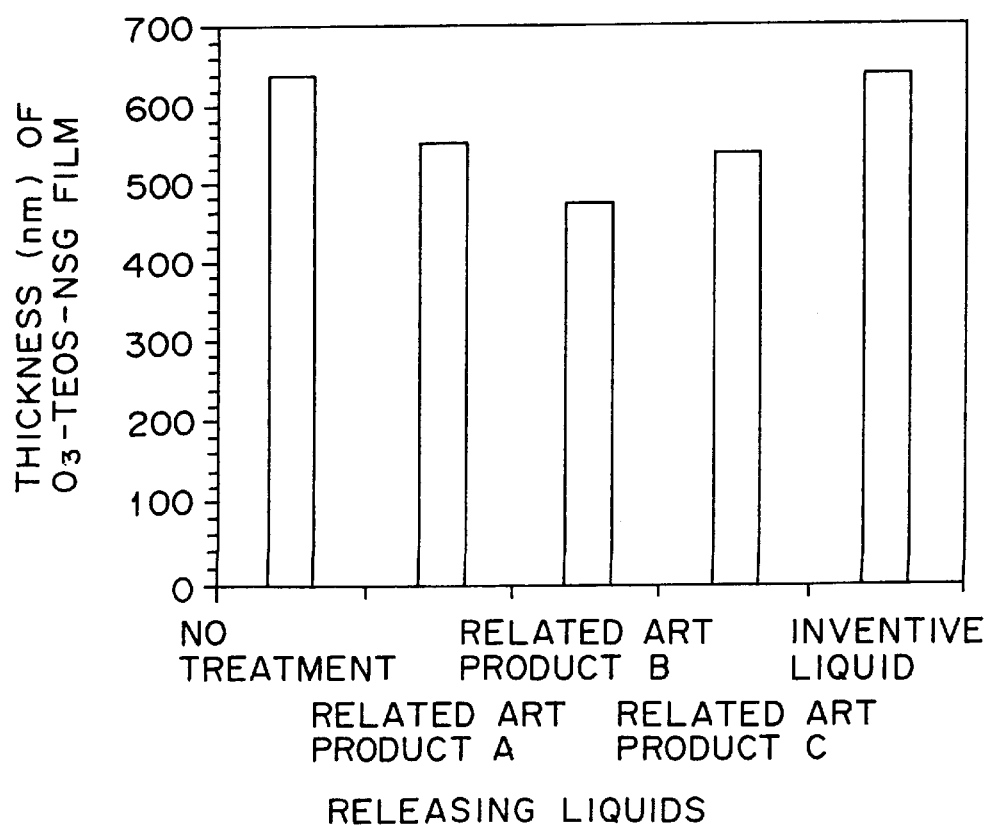
FIG. 5 is a graph showing a relationship between a releasing liquid used for treatment of a plasma TEOS film and a thickness of a $O_3$-TEOS-NSG film formed on the plasma TEOS film treats by the releasing liquid.

Hereinafter, the present invention will be described in detail with reference to the accompanying drawings.

A method of fabricating a semiconductor device according to the present invention is characterized by including the steps of: forming an interconnection pattern on the surface of a semiconductor substrate by etching; treating the interconnection pattern and a portion, not covered with the interconnection pattern, of the substrate surface using an organic amine based resist releasing liquid containing at least a lower aminoalcohol, water, and an anti-corrosion agent; and forming a $SiO_2$ film on the interconnection pattern and the portion, not covered with the interconnection pattern, of the substrate surface, using ozone and an organic silicon source.

For example, as shown in FIG. 1A, an Al film $22_X$ as an interconnection layer is formed on an oxide film 21 made from $SiO_2$ formed on a semiconductor substrate 20. The Al film $22_X$ is then patterned by lithography and reactive ion etching (RIE) into an Al interconnection pattern 22 shown in FIG. 1B. Here, as the semiconductor substrate 20, substrates made from various materials may be used, such as a silicon substrate or a silicon substrate on the surface of which a thin film is formed.

Next, as the post-etching treatment, the Al interconnection pattern 22 and a portion, not covered with the Al interconnection pattern 22, of the surface of the oxide film 21 formed on the semiconductor substrate 20 are treated using an inventive organic amine based resist releasing liquid, to remove the remaining resist and sub-products by reaction between the resist and etching gas upon formation of the Al interconnection pattern 22.

The inventive organic amine based resist releasing liquid contains at least a lower aminoalcohol, water, and an anticorrosion agent. As the lower aminoalcohol contained in the inventive organic amine based resist releasing liquid, it is preferable the two kinds or more of lower aminoalcohols each having a molecular weight which may be preferably in a range of 100 or less are used.

Specific examples of the above lower aminoalcohols may include hydroxyl amine, or more preferably, monoethanol amine.

If the organic amine based resist releasing liquid contains an aminoalcohol having a molecular weight greater than 100, there occurs an inconvenience of poor undercoat dependence.

As the anti-corrosion agent contained in the inventive organic amine based resist releasing liquid, it is preferable that catechol or a compound similar to catechol are used. The content of the anti-corrosion agent may be preferably in a range of 5 wt % or more. If the content is less than 5 wt %, metal etching may be promoted, although it depends on the kind of the anti-corrosion agent.

The average molecular weight of the entire inventive organic amine based resist releasing liquid is preferably in a range of 100 or less. If the average molecular weight is greater than 100, there occurs an inconvenience of poor undercoat dependence.

The manner of treating the entire surface of a substrate, on which an interconnection pattern is formed by etching, using the inventive organic amine based resist releasing liquid is not particularly limited but may be same as the related art manner of treating the entire surface of the substrate using a related art organic amine based resist releasing liquid. For example, the substrate may be dipped in the organic amine based resist releasing liquid, or the organic amine based resist releasing liquid may be sprayed on the substrate surface.

After post-etching treatment of the substrate using the organic amine based resist releasing liquid, as shown in FIG. 1C, a $SiO_2$ film such as a $O_3$-TEOS-NSG film 23 is formed as an interlayer insulating film by the film formation apparatus 1 shown in FIG. 3. After that, the next interconnection pattern is formed as needed, to fabricate a semiconductor device.

According to the present invention, as described above, after formation of the Al interconnection pattern 22, the Al interconnection pattern 22 and a portion, not covered with the Al interconnection pattern, of the substrate surface may be directly treated by the organic amine based resist releasing liquid. However, for example, prior to the treatment using such an organic amine based resist releasing liquid, the Al interconnection pattern and the surface, not covered with the Al interconnection pattern, of the substrate surface may be treated by $O_2$ plasma. The $O_2$ plasma treatment is carried out, for example, in accordance with the following conditions:

flow rate of $O_2$: 100 sccm pressure: 0.1 Torr

RF power: 200 W

The $O_2$ plasma treatment is effective, especially, in the case of forming an interconnection pattern made from Al—Cu. In this case, the $O_2$ plasma treatment makes it possible to prevent occurrence of elution of Al in the subsequent treatment using the organic amine based resist releasing liquid.

According to the present invention, after treatment using the organic amine based resist releasing liquid and before formation of the $SiO_2$ film, an oxide film covering the interconnection pattern may be formed by plasma discharge using an organic silicon source.

For example, an Al interconnection pattern 22 is formed on an oxide film 21 formed on a semiconductor substrate 20 in the same procedure as that shown in FIGS. 1A and 1B, and the Al interconnection pattern 22 and a portion, not covered with the Al interconnection pattern 22, of the substrate surface are treated by the organic amine based resist releasing liquid. After that, prior to formation of a $O_3$-TEOS-NSG film 23, as shown in FIG. 2A, a plasma TEOS film 24 (for example, thickness: 300 nm) is formed by plasma discharge using an organic silicon source in such a manner as to cover the Al interconnection pattern 22. The formation of the plasma TEOS film 24 is carried out, for example, in accordance with the following conditions:

flow rate of TEOS: 60 sccm flow rate of $O_2$: 600 sccm pressure: 8.5 Torr

RF power; 700 W

By forming the film in the above conditions, TEOS is dissociated from $O_2$ to form an oxide film made from $SiO_2$ (plasma TEOS film 24).

After formation of the plasma TEOS film 24, as in the case where the plasma TEOS film 24 is not formed, as shown in FIG. 2B, a $O_3$-TEOS-NSG film 23 is formed to cover the plasma TEOS film 24 using ozone and an organic silicon source by the film formation apparatus 1 shown in FIG. 3.

The formation of the plasma TEOS film 24 prior to formation of the $O_3$-TEOS-NSG film 23 is effective to compensate for the poor film quality of the $O_3$-TEOS-NSG film 23 by the plasma TEOS film 24.

While the various modes of the method of fabricating a semiconductor device according to the present invention, including the step of treating an interconnection pattern formed on a semiconductor substrate using the organic amine based resist releasing liquid and forming a $O_3$-TEOS-NSG film thereon, have been described above, the present invention can be further variously modified without departing from the scope in which an interconnection pattern formed on a semiconductor substrate is treated using the specific inventive organic amine based resist releasing liquid.

For example, in the above description, after treatment using the organic amine based resist releasing liquid, the $O_3$-TEOS-NSG film is formed on the interconnection pattern as the $SiO_2$ film. However, a $O_3$-TEOS-BPSG film formed using ozone, TEOS, TMP (Trimethyl Phosphide), and TEB (Triethyl Boron) may be formed as the $SiO_2$ film.

The interconnection pattern is not limited to the pattern made from Al but may be a pattern made from Al—Cu, W, or Cu.

According to the present invention, a semiconductor device may be fabricated in the same procedure as that of the related art method except that an interconnection pattern formed on a semiconductor substrate is treated by the specific inventive organic amine based resist releasing liquid.

The present invention will be more clearly understood with reference to the following examples:

INVENTIVE EXAMPLE 1

An Al interconnection pattern of Al interconnections each having a width of 600 nm and a height of 650 nm was formed on a silicon substrate by dry etching in such a manner as when the Al interconnections were spaced from each other at specific intervals. The etching condition was as follows:

Etching Condition pressure: 7 m Torr flow rate of $BCl_3/Cl_2$: 40/70 sccm microwave: 350 mA RF power: 120 W Next, the Al interconnection pattern and a portion, not covered with the Al interconnection pattern, of the substrate surface were treated using the inventive organic amine based resist releasing liquid containing a lower aminoalcohol, water, and an anti-corrosion agent.

Figure 6:
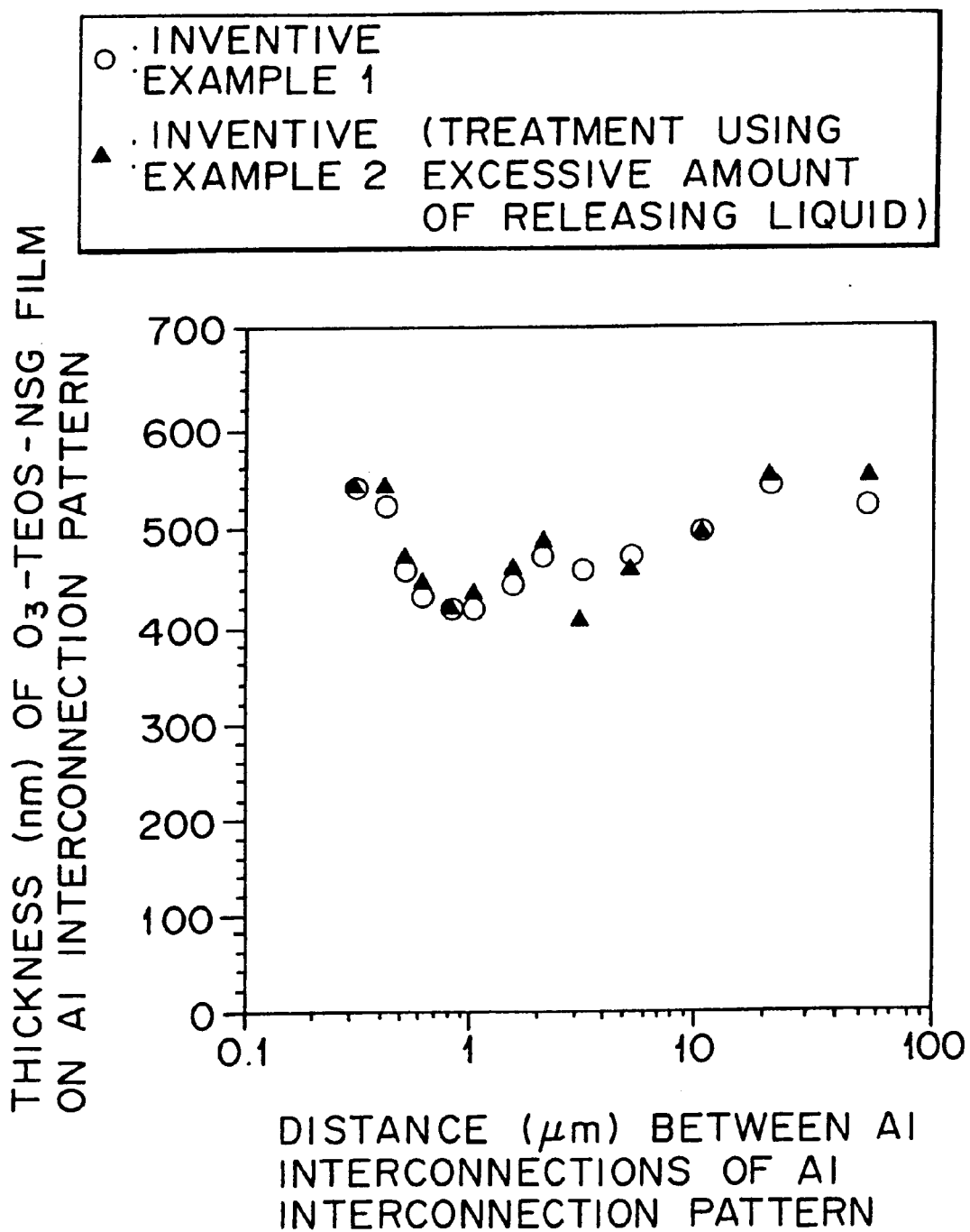

Then, an $O_3$-TEOS-NSG film was formed on the entire surface of the silicon substrate by the film formation apparatus 1 shown in FIG. 3 in accordance with the following conditions:

substrate temperature: 350° C.

concentration of $O_3$: 150 mg/slm flow rate of $O_3/O_2$: 5.7 slm flow rate of separator $N_2$: 6 slm flow rate of TEOS: 10 sccm film formation time: 5 min speed of belt: 3 inch/min With respect to the sample thus prepared, a relationship between a space width between Al interconnections of the Al interconnection pattern and the thickness of the $O_3$-TEOS-NSG film formed on the Al interconnection pattern was measured. The result is shown in FIG. 6. From the result shown in FIG. 6, it is revealed that the pattern dependence on the $O_3$-TEOS-NSG film 23 formed in Inventive Example 1 is significantly reduced.

INVENTION EXAMPLE 2

The procedure described in Inventive Example 1 was repeated except the organic amine based resist releasing liquid was sprayed on the silicon substrate in order to excessively treat the entire surface of the silicon substrate as compared with Inventive Example 1.

With respect to the sample thus prepared, like Inventive Example 1, a relationship between a space width between Al interconnections of the Al interconnection pattern and the thickness of the $O_3$-TEOS-NSG film formed on the Al interconnection pattern was measured. The result is shown in FIG. 6. From the result shown in FIG. 6, it is revealed that even if the entire surface of the silicon substrate is excessively treated using the organic amine based resist releasing liquid, the pattern dependence on the $O_3$-TEOS-NSG film 23 can be significantly reduced as compared with the related art example.

COMPARATIVE EXAMPLE 1

The procedure described in Inventive Example 1 was repeated except that a related art product A containing an aminoalcohol having the molecular weight of greater than 100 was used as the organic amine based resist releasing liquid.

With respect to the sample thus prepared, like Inventive Example 1, a relationship between the space width between Al interconnections of the Al interconnection pattern and the thickness of the $O_3$-TEOS-NSG film formed on the Al interconnection pattern was measured. The result is shown in FIG. 7. For comparison, the result of Inventive Example 1 is also shown in FIG. 7. From the result shown in FIG. 7, it is revealed that when the related art product A is used as the organic amine based resist releasing liquid, the pattern dependence on the $O_3$-TEOS-NSG film 23 becomes larger.

COMPARATIVE EXAMPLE 2

The procedure described in Inventive Example 1 was repeated except a related art product C containing an aminoalcohol having the molecular weight of greater than 100 was used as the organic amine based resist releasing liquid.

With respect to the sample thus prepared, like Inventive Example 1, a relationship between the space width between Al interconnections of the Al interconnection pattern and the thickness of the $O_3$-TEOS-NSG film formed on the Al interconnection pattern was measured. The result is shown in FIG. 7. From the result shown in FIG. 7, it is revealed that when the related art product C is used as the organic amine based resist releasing liquid, the pattern dependence on the $O_3$-TEOS-NSG film 23 becomes larger.

COMPARATIVE EXAMPLE 3

The procedure described in Inventive Example 1 was repeated except that the entire surface of the silicon substrate was not treated by any organic amine based resist releasing liquid.

With respect to the sample thus prepared, like Inventive Example 1, a relationship between the space width between Al interconnections of the Al interconnection pattern and the thickness of the $O_3$-TEOS-NSG film formed on the Al interconnection pattern was measured. The result is shown in FIG. 7. From the result shown in FIG. 7, it is revealed that when the entire surface of the silicon substrate is not treated by any organic amine based resist releasing liquid, the pattern dependence on the $O_3$-TEOS-NSG film 23 is comparable to that in Inventive Example 1. However, it is undesirable to omit the treatment using the organic amine based resist releasing liquid, because sub-products produced by dry etching cannot be removed in the case where the treatment using the organic amine based resist releasing liquid is omitted.

What is claimed is:

1. A method of fabricating a semiconductor device, comprising the steps of:

forming an interconnection pattern on the surface of a semiconductor substrate by etching;

treating the interconnection pattern and a portion, not covered with the interconnection pattern, of the substrate surface using an organic amine based resist releasing liquid containing at least two different lower aminoalcohols where each has a molecular weight not greater than 100, water, and an anti-corrosion agent; and forming a $SiO_2$ film on the interconnection pattern and the portion, not covered with the interconnection pattern, of the substrate surface, using ozone and an organic silicon source.

2. A method of fabricating a semiconductor device according to claim 1, wherein the anti-corrosion agent contained in the organic amine based resist releasing liquid contains at least catechol.

3. A method of fabricating a semiconductor device according to claim 2, wherein the anticorrosion agent is present in a range of 5 wt % or more.

4. A method of fabricating a semiconductor device according to claim 1, wherein the average molecular weight of the entire organic amine based resist releasing liquid is in a range of not greater than 100.

5. A method of fabricating a semiconductor device according to claim 1, further comprising the step of treating the interconnection pattern and the portion, not covered with the interconnection pattern, of the substrate surface using $O_2$ plasma, said step being performed after said step of forming the interconnection pattern and before said step of treating the interconnection pattern and the portion, not covered with the interconnection pattern, of the substrate surface using the organic amine based resist releasing liquid.

6. A method of fabricating a semiconductor device according to claim 1, further comprising the step of forming an oxide film covering the interconnection pattern by plasma discharge using an organic silicon source, said step being performed after said step of treating the interconnection pattern and the portion, not covered with the interconnection pattern, of the substrate surface using the organic amine based resist releasing liquid and before said step of forming the $SiO_2$ film.

7. A method of fabricating a semiconductor device according to claim 5, further comprising the step of forming an oxide film covering the interconnection pattern by plasma discharge using an organic silicon source, said step being performed after said step of treating the interconnection pattern and the portion, not covered with the interconnection pattern, of the substrate surface using the organic amine based resist releasing liquid and before said step of forming the $SiO_2$ film.

8. A method of fabricating a semiconductor device, comprising the steps of:

forming an interconnection pattern on the surface of a semiconductor substrate by an etching process;

treating the interconnection pattern, and a portion of the substrate surface that is not covered with the interconnection pattern, using an organic amine based resist releasing liquid containing at least a lower aminoalcohol, water, and an anticorrosion agent; and forming a $SiO_2$ film on the interconnection pattern, and the portion of the substrate surface not covered with the interconnection pattern, using ozone and an organic silicon source, wherein the average molecular weight of the entire organic amine based resist releasing liquid is in a range of not greater than 100.

9. A method of fabricating a semiconductor device according to claim 8, wherein the lower aminoalcohol contained in the organic amine based resist releasing liquid comprises at least two kinds of lower aminoalcohols each having a molecular weight not greater than 100.

10. A method of fabricating a semiconductor device according to claim 8, wherein the anti-corrosion agent contained in the organic amine based resist releasing liquid contains at least catechol.

11. A method of fabricating a semiconductor device according to claim 8, further comprising the step of treating the interconnection pattern and the portion, not covered with the interconnection pattern, of the substrate surface using $O_2$ plasma, said step being performed after said step of forming the interconnection pattern and before said step of treating the interconnection pattern and the portion, not covered with the interconnection pattern, of the substrate surface using the organic amine based resist releasing liquid.

12. A method of fabricating a semiconductor device according to claim 8, further comprising the step of forming an oxide film covering the interconnection pattern by plasma discharge using an organic silicon source, said step being performed after said step of treating the interconnection pattern and the portion, not covered with the interconnection pattern, of the substrate surface using the organic amine based resist releasing liquid and before said step of forming the $SiO_2$ film.

13. A method of fabricating a semiconductor device according to claim 11, further comprising the step of forming an oxide film covering the interconnection pattern by plasma discharge using an organic silicon source, said step being performed after said step of treating the interconnection pattern and the portion, not covered with the interconnection pattern, of the substrate surface using the organic amine based resist releasing liquid and before said step of forming the $SiO_2$ film.

14. A method of fabricating a semiconductor device, comprising the steps of:

forming an interconnection pattern on the surface of a semiconductor substrate by an etching process;

treating the interconnection pattern, and a portion of the substrate surface that is not covered with the interconnection pattern, using an organic amine based resist releasing liquid containing at least a lower aminoalcohol, water, and an anticorrosion agent;

forming an oxide film covering the interconnection pattern by plasma discharge using an organic silicon source; and forming a $SiO_2$ film on the interconnection pattern, and the portion of the substrate surface not covered with the interconnection pattern, using ozone and an organic silicon source.

15. A method of fabricating a semiconductor device according to claim 14, wherein the lower aminoalcohol contained in the organic amine based resist releasing liquid comprises at least two kinds of lower aminoalcohols each having a molecular weight not greater than 100.

16. A method of fabricating a semiconductor device according to claim 14, wherein the anti-corrosion agent contained in the organic amine based resist releasing liquid contains at least catechol.

17. A method of fabricating a semiconductor device according to claim 14, further comprising the step of treating the interconnection pattern and the portion, not covered with the interconnection pattern, of the substrate surface using $O_2$ plasma, said step being performed after said step of forming the interconnection pattern and before said step of treating the interconnection pattern and the portion, not covered with the interconnection pattern, of the substrate surface using the organic amine based resist releasing liquid.

18. A method of fabricating a semiconductor device according to claim 14, wherein the average molecular weight of the entire organic amine based resist releasing liquid is in a range of not greater than 100.

* * * * *